United States Patent

Herbert et al.

[11] Patent Number: 5,898,198
[45] Date of Patent: Apr. 27, 1999

[54] RF POWER DEVICE HAVING VOLTAGE CONTROLLED LINEARITY

[75] Inventors: Francois Herbert, San Mateo; James R. Parker, Cupertino; Daniel Ng, Campbell, all of Calif.; Howard D. Bartlow, West Linn, Oreg.

[73] Assignee: Spectrian, Sunnyvale, Calif.

[21] Appl. No.: 08/906,741

[22] Filed: Aug. 6, 1997

Related U.S. Application Data

[63] Continuation-in-part of application No. 08/905,513, Aug. 4, 1997.

[51] Int. Cl.$^6$ .......................... H01L 29/76; H01L 29/94; H01L 31/062; H01L 31/113
[52] U.S. Cl. .......................................... 257/319; 257/401
[58] Field of Search ................................ 257/319, 401, 257/316, 331

[56] References Cited

U.S. PATENT DOCUMENTS

| | | |
|---|---|---|
| 4,511,854 | 4/1985 | Kishida ................................ 330/279 |
| 5,119,149 | 6/1992 | Weitzel et al. ....................... 357/15 |
| 5,243,234 | 9/1993 | Lin et al. ............................. 307/304 |
| 5,252,848 | 10/1993 | Adler et al. ......................... 257/328 |
| 5,446,304 | 8/1995 | Sameshima et al. . |
| 5,477,068 | 12/1995 | Ozawa . |
| 5,736,757 | 4/1998 | Paul . |

OTHER PUBLICATIONS

Alan Wood, et al., "High Performance Silicon LDMOS Technology for 2GHz RF Power Amplifier Applications", 1996 IEEE, pp. ???.

*Primary Examiner*—Stephen D. Meler
*Attorney, Agent, or Firm*—Townsend and Townsend and Crew LLP; Henry K. Woodward

[57] ABSTRACT

A linear MOSFET device includes a shield plate positioned between a drain and an overlying gate. A voltage bias is applied to the shield plate to maintain linear operation of the device for RF power amplification. An AC ground is preferably connected to the shield plate. The voltage bias can be varied for matching of parallel connected devices, for responding to peak input signals, and for temperature compensation.

48 Claims, 10 Drawing Sheets

T = optional delay stage on low power input side 5,898,198

RF POWER DEVICE HAVING VOLTAGE CONTROLLED LINEARITY

This patent application is a continuation-in-part of co-pending application Ser. No. 08/905,513 filed Aug. 4, 1997.

BACKGROUND OF THE INVENTION

This invention relates generally to RF power amplifiers, and more particularly the invention relates to a semiconductor field effect transistor having a voltage biased buried shield electrode which provides adjustable linearity in device operation.

A typical RF electrical signal power amplifier has multiple stages including a driver stage and a plurality of output stages connected in parallel. For applications requiring amplification of signals with very high peak to average power requirements, additional amplifier stages must be provided for the peak power without signal clipping. However, this is not an efficient use of silicon and results in poor overall performance and high cost.

Heretofore, circuits have been proposed to give improved amplified linearity with varying signal input power. Kishida U.S. Pat. No. 4,511,854 discloses a circuit which minimizes clipping by boosting linearity as signal peaks are received by the amplifier. However, the proposed linearity correction is a function of output signal and not the input signal.

For best device RF operation, the parasitic capacitances ($C_{rss}$, $C_{oss}$) and device resistance ($R_{dson}$) of devices must be minimized. Optimization of the parameters is typically bounded by certain specifications, for example a minimum breakdown voltage ($BV_{dss}$) is typically specified, for example greater than 60 Volts for cellular base station amplifiers. Gate to source capacitance, $C_{rss}$, can be minimized by using polycide gate structures which can minimize gate to drain overlap, but the device resistance ($R_{dson}$) and transconductance linearity typically degrade due to a limit on the maximum N-well doping for such devices.

Adler et al., U.S. Pat. No. 5,252,848 discloses a field effect transistor device which provides reduced source to drain resistance in RF applications. The structure includes extending the source electrode over a polysilicon gate to provide increased isolation of the gate from the drain and substrate. However, the structure does not reduce the direct capacitance coupling of the gate electrode to the underlying drain.

Weitzel et al. U.S. Pat. No. 5,119,149 discloses a field effect transistor having a gate-drain shield on the device surface to reduce lateral gate-drain capacitance. The device does not shield vertical capacitance of the overlapping gate and drain region.

Lin et al., U.S. Pat. No. 5,243,234 discloses a dual gate field effect transistor in which a second gate is placed on top of the primary gate of a lateral DMOS transistor and is used to modulate conductivity of the channel. However, the device has very high gate to drain capacitance since the second gate is directly over the drain region. Since gate to substrate capacitance is not minimized, the device is not well suited for RF applications.

The present invention is directed to a field effect transistor structure including a shield electrode between the gate and drain regions of the transistor and which can be used as a feedback electrode in providing increased linearity of the device as an RF power amplifier.

SUMMARY OF THE INVENTION

In accordance with the invention, a field effect transistor, either lateral or vertical structure, includes a shield electrode between the control gate and the drain which can be voltage biased as part of a feedback loop to increase the linearity of device operation as a function of input power and frequency.

The buried shield structure is connected to a voltage higher than the source, lower than the drain, and which is an effective AC ground when compared to the drain current. The buried shield electrode shields the gate from the drain, and hence minimizes gate-drain capacitance since a shield plate is an effective AC ground. DC or lower frequency voltage can be applied to the shield to accumulate charge in the semiconductor material under the buried shield electrode, which modulates the conductivity of the region to minimize and control drain resistance.

The invention and application thereof will be more readily apparent from the following detailed description and appended claims when taken with the drawing.

DETAILED DESCRIPTION OF ILLUSTRATIVE EMBODIMENTS

The invention is applicable to known field effect transistor structure having shield electrodes, such as devices disclosed in U.S. Pat. No. 5,252,848 and No. 5,119,149, supra. However, the invention will be described with respect to the devices disclosed in copending application Ser. No. 08/905,513, supra.

Figure 1A:
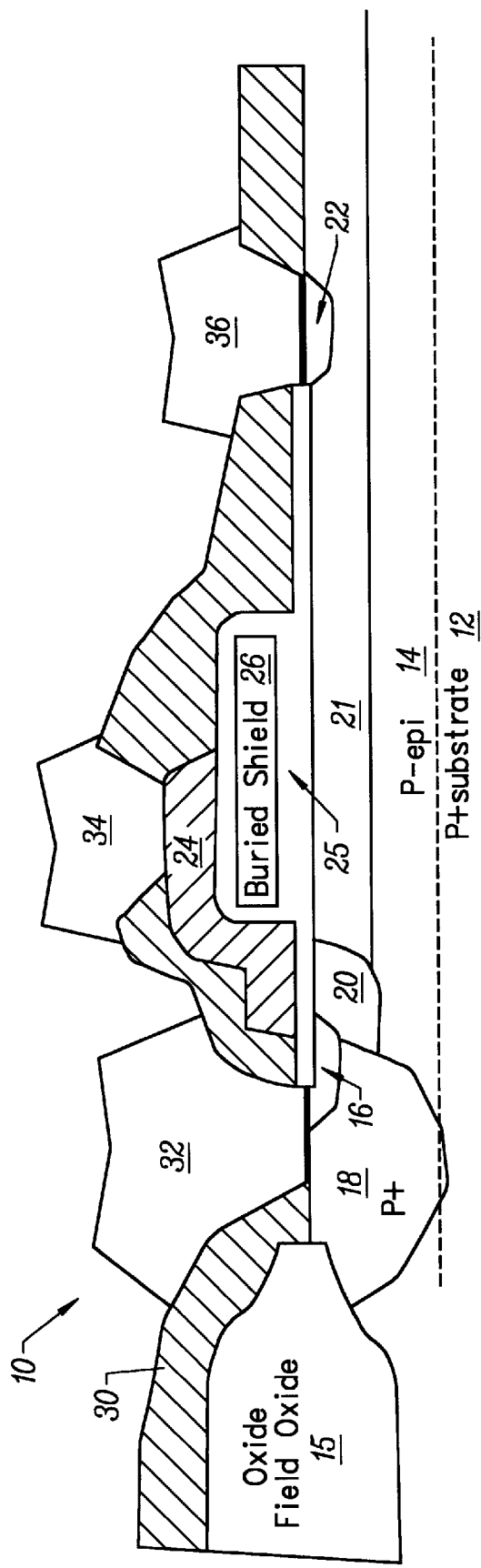
FIGS. 1A, 1B, 1C are a section view, plan view, and electrical schematic of an RF power device having voltage control linearity in accordance with one embodiment of the invention.
Figure 1C:
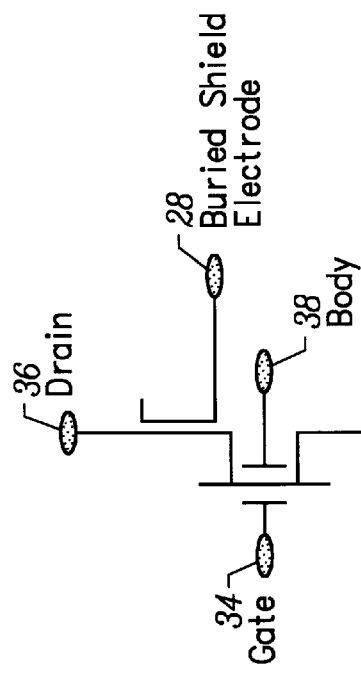
Figure 1B:
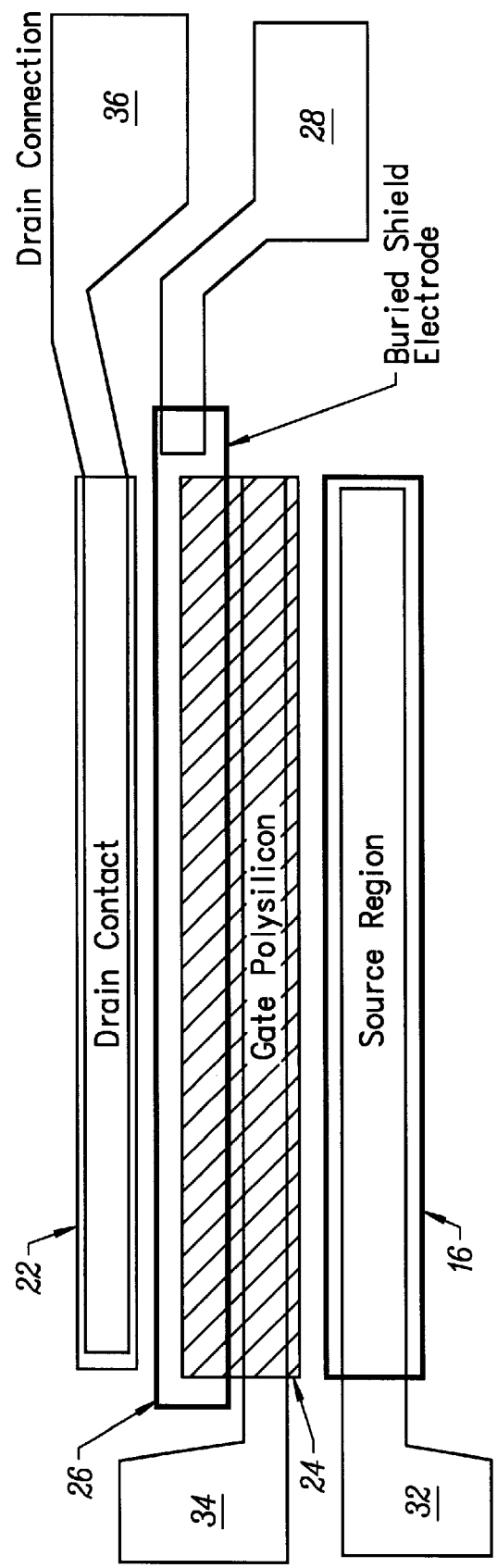

FIGS. 1A, 1B, 1C are a section view, plan view, and electrical schematic of an RF power device having voltage control linearity in accordance with one embodiment of the invention. The device and fabrication thereof as a lateral DMOS and a vertical DMOS transistor is disclosed in detail in co-pending application Ser. No. 08/905,513 supra. The device shown generally at 10 comprises a P+ substrate 12 on which is formed a P– epitaxial layer 14. A field oxide 15 defines a device region in the surface of epitaxial layer 14, and an N+ source region 16 is formed in a P+ base region 18 by double-diffusion processing with base region 18 having a P doped extension 20 which defines a channel region of the transistor. N– doped region 21 and a N+ doped region 22 in epitaxial layer 14 define the drain of the transistor. A gate 24 is formed over a channel in P doped extension 20 with a dielectric 25 electrically separating gate 24 from the channel and the epitaxial layer 14.

In accordance with a feature of the invention, a conductive shield plate 26 is provided between gate 24 and the N– region 21 of the drain. Shield plate 26 extends beyond the device region and has an electrode 28 for connecting AC ground and a DC potential to the shield plate. Dielectric material 30 (e.g., silicon-nitride or other suitable material) is provided on the surface of the device with openings therethrough for forming a source contact 32, gate contact 34, and drain contact 36. A body contact 38 to the substrate is shown in FIG. 1C.

By providing the shield plate under the gate and between the gate and the drain as disclosed in copending application Ser. No. 08/905,513, capacitance therebetween can be minimized by more than a power of ten as compared to the prior art, while maximizing the frequency response of an RF power device. In operation, the gate electrode is preferably connected to a DC potential and coupled through a capacitor to AC ground. Thus, any electric field emanating from the gate electrode is terminated on the grounded shield plate, thereby minimizing $C_{gd}$. Some increase in input capacitance ($C_{in}$ or $C_{iss}$) can be compensated by input impedance matching. The increase in output capacitance ($C_{out}$ or $C_{oss}$) is minimal.

FIG. 1B is a plan view of the device of FIG. 1A, and shows the positioning of source region 16, N+ drain region 22, polysilicon gate electrode 24, buried shield electrode 26, buried shield electrode connection 28, source connection 32, gate connection 34, and drain connection 36. The body connection 38 is on the bottom surface of the P+ substrate and not shown in the plan view. FIG. 1C is a device schematic showing the buried shield electrode 28, source electrode 32, gate contact 34, drain contact 36, and body contact 38.

Figure 2A:
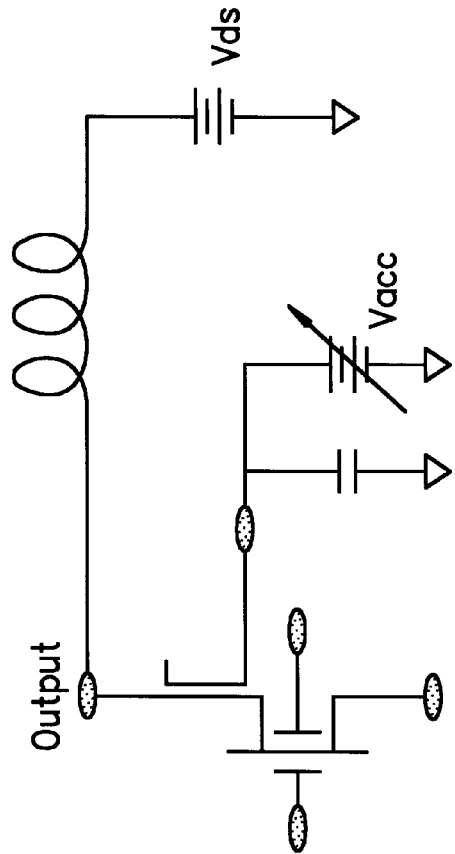
FIGS. 2A, 2B are a schematic and a plot of drain to source current versus gate-source voltage for an application of the device of FIG. 1.
Figure 2B:
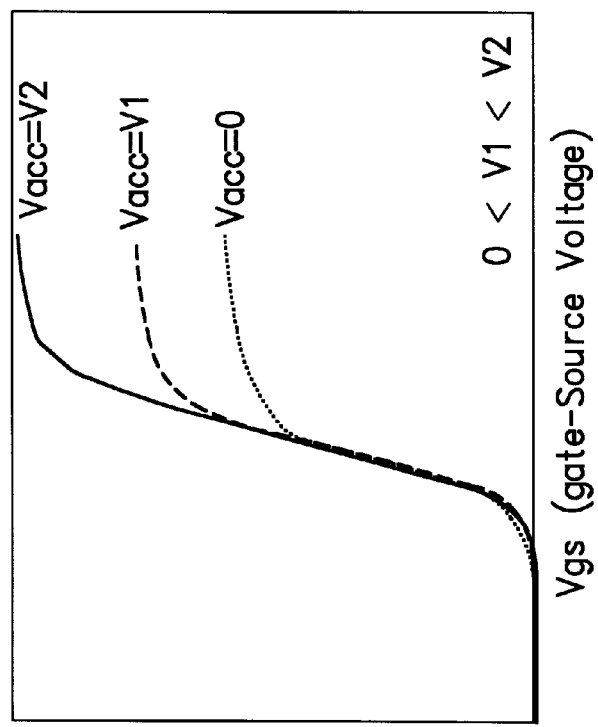

The presence of the buried shield electrode between the gate and drain of the field effect device minimizes parasitic gate to drain capacitance. Further, charge in the accumulation layer of the drain is effectively controlled by a DC voltage applied to the buried shield electrode, with an increasing voltage on the buried shield providing stronger accumulation and lower source to drain resistance ($R_{dson}$), and higher transconductance linearity. The buried shield electrode is effectively connected to AC ground through a capacitor. FIG. 2A is a schematic illustrating the biasing the device, and FIG. 2B is a plot of gate-source voltage versus drain to source current for DC accumulation voltages applied to the buried shield.

The shield plate is preferably formed from deposited polysilicon; however, other device configurations and materials for gate and buried shield are possible as described in co-pending application Ser. No. 08/905,513 supra. Polysilicon can be used for local interconnects as well as for the gate and buried electrodes. Metal (preferably multiple layers) is used for a connection between cells and to bond pads. The device does not require complex or costly processing as one additional polysilicon deposition, one additional mask, and one additional etch are employed in one embodiment. The gate to drain parasitic capacitance can be reduced by more than 10–20 fold, which will maximize the frequency response of any power lateral DMOS or vertical DMOS MOSFET device. As will be described hereinbelow, simple external adjustment of device linearity can be provided for either device matching or high peak to average applications or for pure linearity enhancements with a fast RF modulation signal.

Figure 3A:
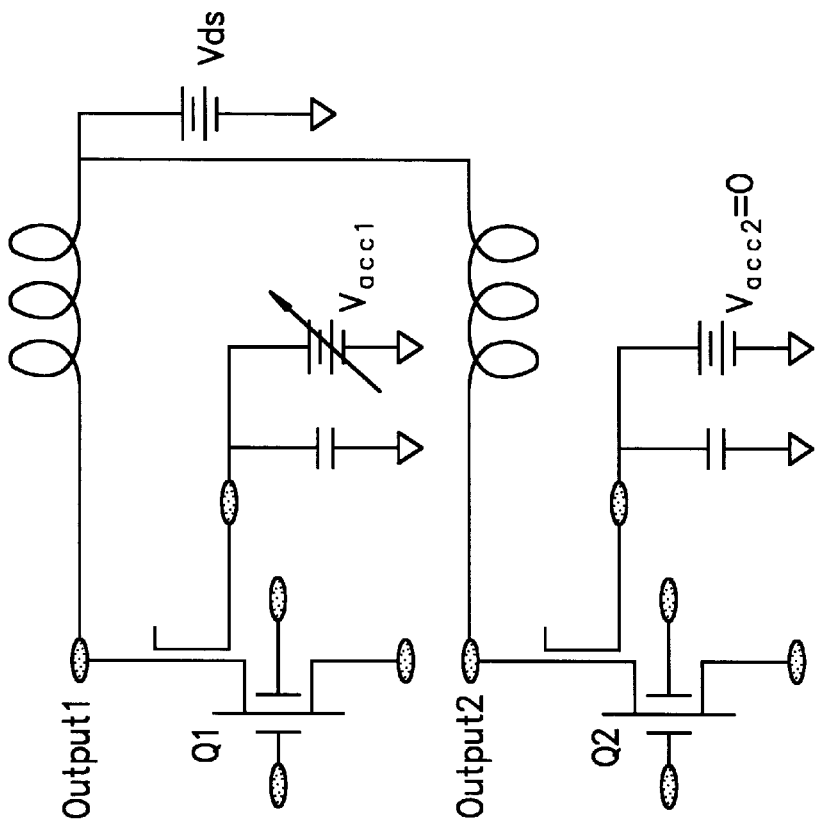
FIGS. 3A, 3B are a schematic and a plot of drain to source current versus gate-source voltage for two matched devices in accordance with the invention.
Figure 3B:
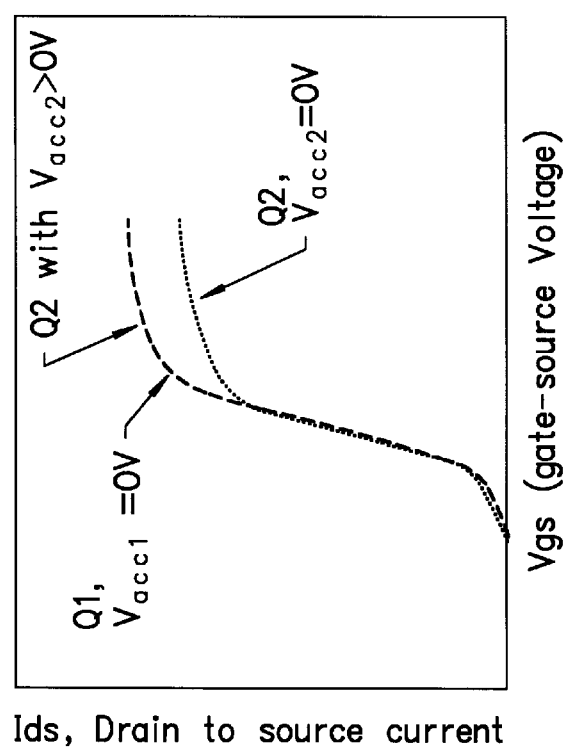

FIGS. 3A, 3B are a schematic and a plot of gate-source voltage versus drain to source current for two parallel devices which are matched by appropriate biasing of the shielded electrodes. The plot illustrates current versus drain for both device DC biases being zero volt and with the voltage bias on device Q1 being greater than zero volt, while the bias on transistor Q2 is zero volt. Improved transconductance results by the suitable biasing of the two devices.

Figure 4A:
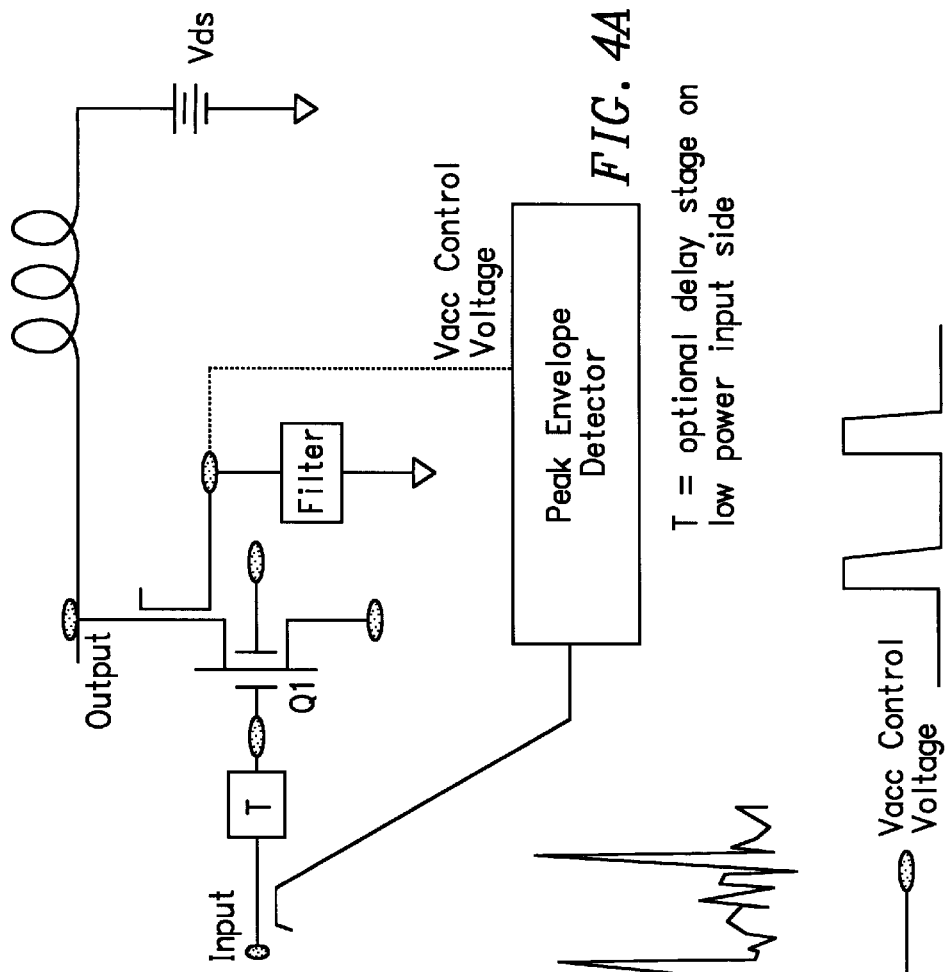
FIGS. 4A, 4B, 4C are a functional block diagram, schematic, and plot of gate-source voltage versus drain to source current for a single device with a peak envelope detector feedback for operation equivalent to two parallel devices in accordance with the invention.
Figure 4B:
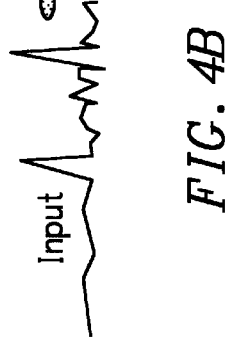
Figure 4C:
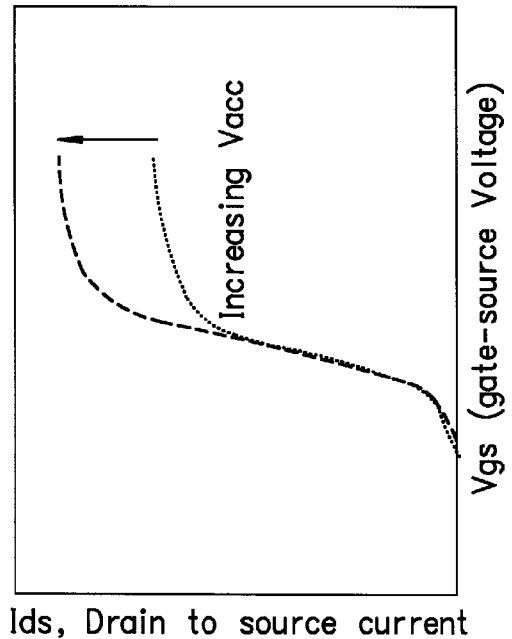

FIGS. 4A, 4B, and 4C illustrate operation of a device with a peak envelope detector feedback to the shield electrode when the input signal to the device has power peaks as illustrated in FIG. 4B. By increasing $V_{acc}$ in response to the peak envelope detector coupled between the input and the shield electrode, drain to source current capability can be linearly increased as illustrated in FIG. 4C. Thus, a single device is equivalent to two devices in parallel without doubling the parasitic capacitances $C_{iss}$, $C_{oss}$, and $C_{rss}$. In FIG. 4A, an optional time delay T can be provided on the low power input side of the device to offset delay in the peak envelope detector and bias of the buried electrode.

Figure 5:
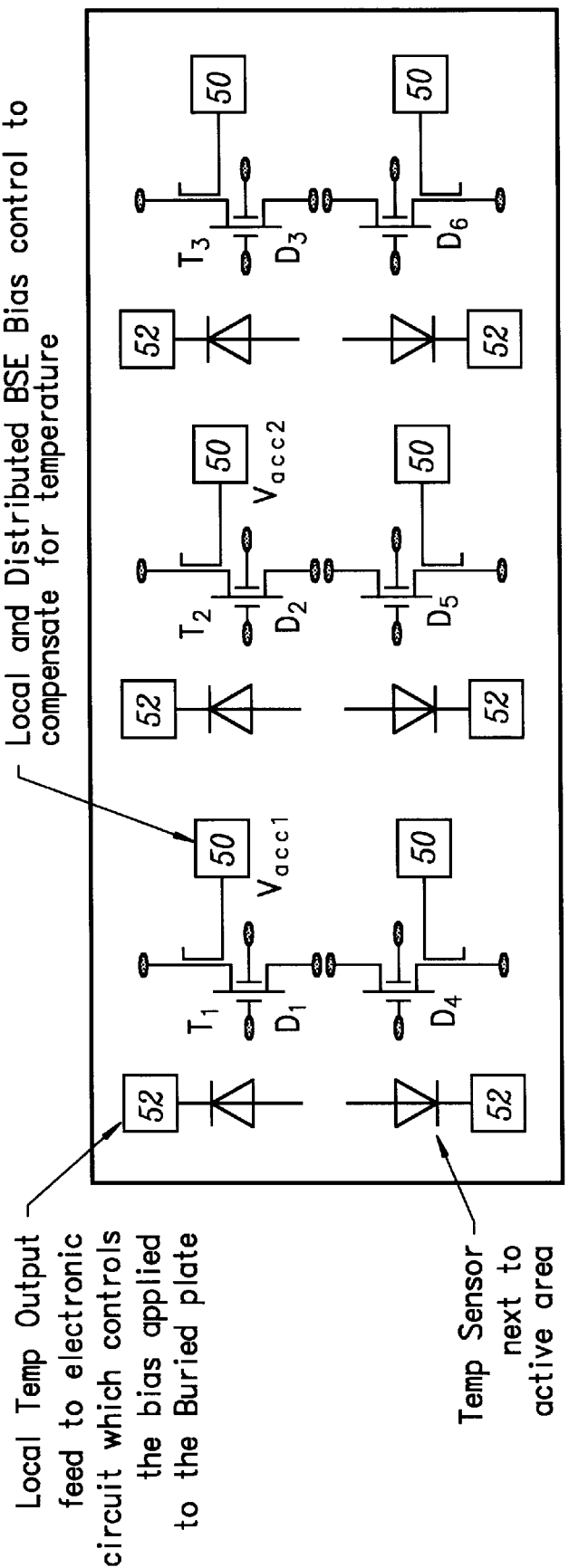
FIG. 5 illustrates a semiconductor substrate with a plurality of devices therein controlled by local temperature feedback in accordance with the invention.

FIG. 5 is a plan view schematic of a temperature compensated array of devices D1–D6, each having local and distributed shield bias control 50 to compensate for temperature as sensed by local temperature output feed 52 which controls the bias applied to the buried plates. For example, if temperature T2 for device D2 is higher than temperature T1 for device D1, the bias on the shield plate of device D2 is adjusted until the temperatures T1 and T2 are equal. As temperature increases, the source to drain resistance ($R_{dson}$) of a MOSFET increases, resulting in lower linearity. The buried shield electrode bias control is used to compensate for the increased $R_{dson}$ by making the shield electrode voltage ($V_{acc}$) a function of local device temperature. The temperature sensors (e.g. diodes) can be distributed throughout the semiconductor die to provide temperature feedback to the buried shield plate bias control.

Figure 6A:
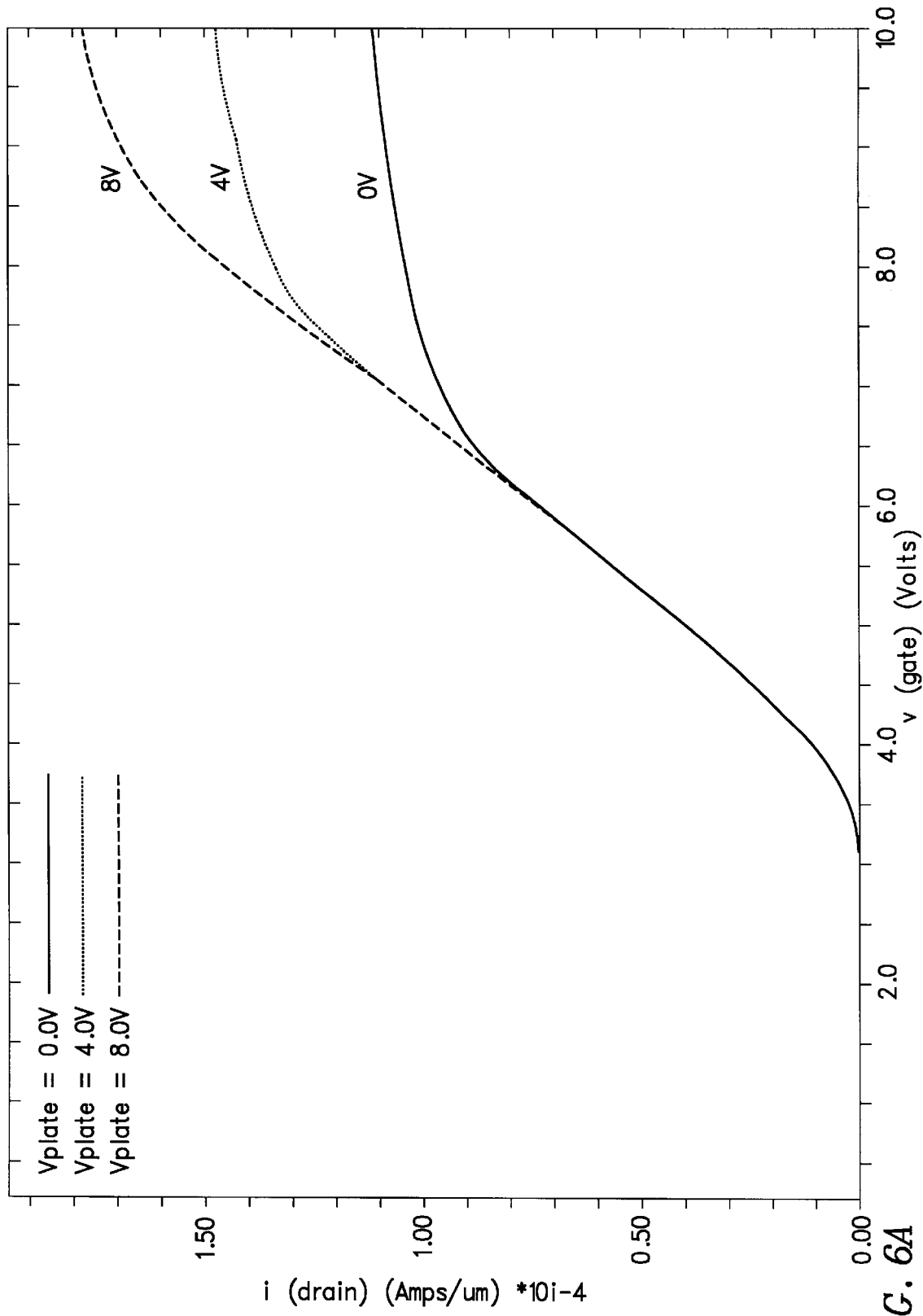
FIGS. 6A–6D are plots of simulated device voltages versus current and capacitances for the device of FIG. 1.
Figure 6B:
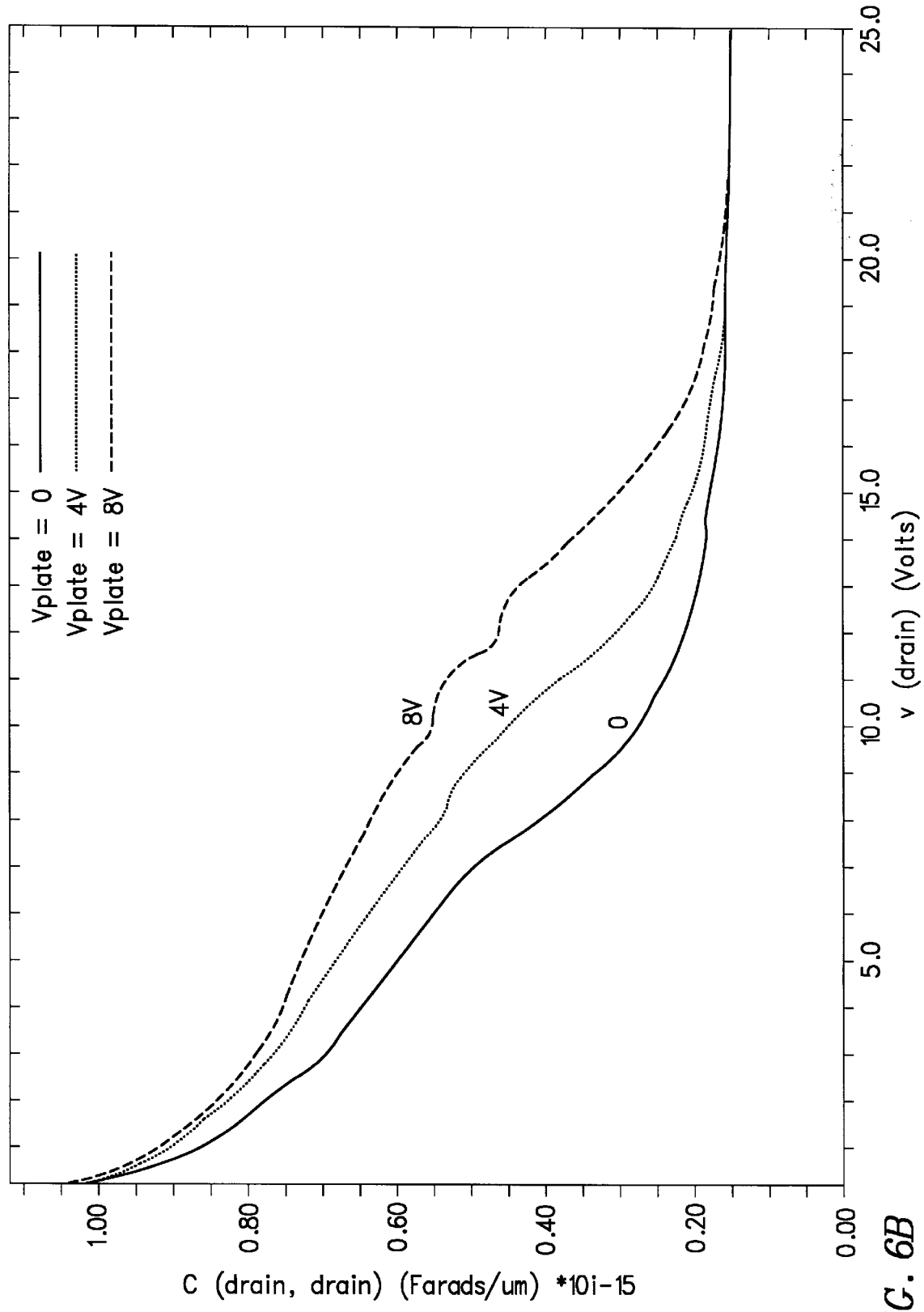
Figure 6C:
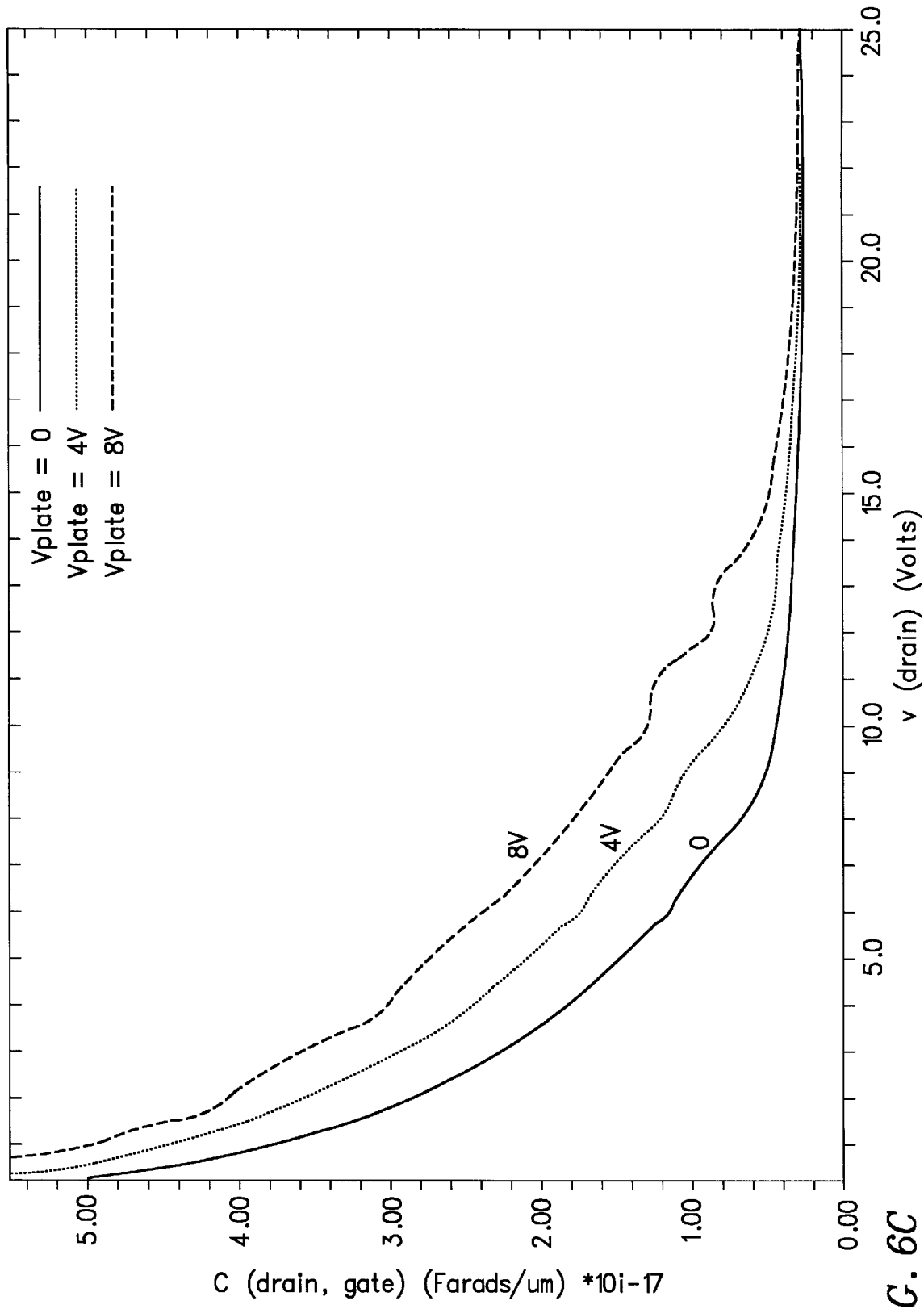
Figure 6D:
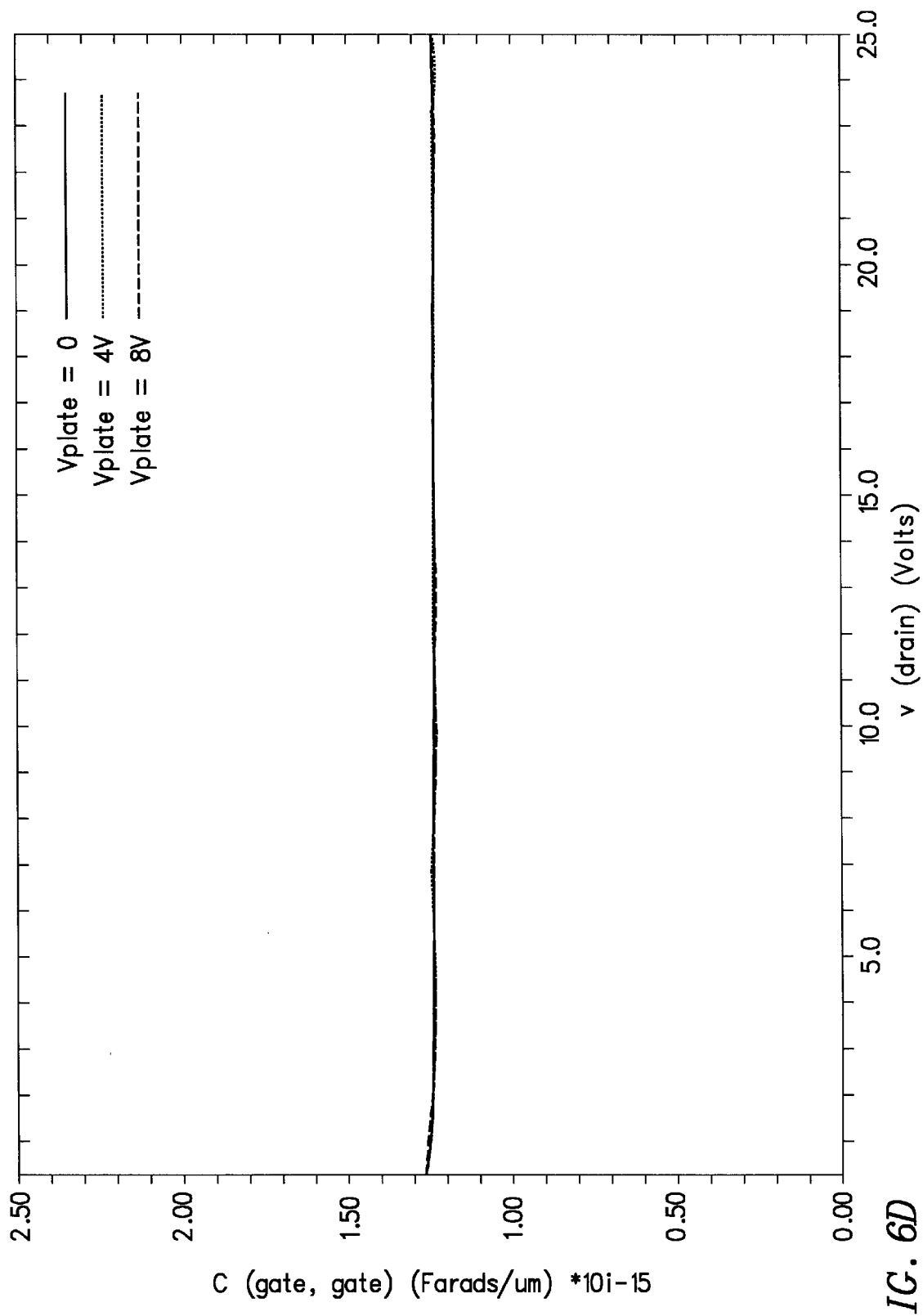

A two dimensional process and device simulation have been performed with results normalized per micron of gate width. By increasing the buried shield electrode voltage, increases in peak linear current capability are achieved. For example, with $V_{acc}=0$, the drain source current remains linear up to 0.85 E-4 A/micron. With $V_{acc}=4$ volts, drain source current remains linear to a maximum of 1.2 E-4 A/micron, and for $V_{acc}=8$ volts, the drain source current remains linear to a maximum of 1.5 E-4 A/micron. FIG. 6A is a plot of drain current versus gate voltage for the shield biasing of 0 volt, 4 volts, 8 volts. FIG. 6B is a plot of drain capacitance (farads per micron) versus drain voltage for plate shielding of 0 volt, 4 volts and 8 volts. FIG. 6C illustrates drain-gate capacitance versus drain voltage for shield biasing of a 0 volt, 4 volts, 8 volts. FIG. 6D is a plot of gate to drain capacitance versus drain voltage for shield biasing of 0 volt, 4 volts, and 8 volts. It is seen from FIG. 6D that the buried shield electrode effectively shields the gate from the drain for all shield plate bias voltages. It is also seen that the capacitance increase is minimized even though linearity is maximized when Vds≧15V (typical bias used for wireless base station applications) $C_{iss}$ remains constant, $C_{oss}$ and $C_{rss}$ increases are negligible, and $C_{rss}$ is approximately 10× lower than achieved using standard structure. A doubling in current carrying capability does not result in a doubling in the capacitances.

There has been described several embodiments of a MOSFET device having a buried shield plate between the gate and drain and suitably biased to achieve increased linear operation in RF power applications. While the invention has been described with reference to specific embodiments, the description is illustrative of the invention and is not to be construed as limiting the invention. For example, the illustrated devices are lateral DMOS devices, but the invention is applicable to vertical DMOS devices also. Thus, various modifications and applications may occur to those skilled in the art without departing from the true spirit and scope of the invention as defined by the appended claims.

What is claimed is:

1. A linear MOSFET device comprising:
   a semiconductor body having a major surface,
   a source region of first conductivity-type abutting said surface,
   a drain region of said first conductivity-type abutting said surface and spaced from said source region by a channel,
   a control gate overlying said channel and part of said drain and insulated therefrom by a dielectric material,
   a shield plate positioned between said gate and said drain and insulated therefrom, said shield plate underlying the gate with no overlap of the channel and positioned between the gate and drain to provide vertical shielding between the gate and the drain, and
   a voltage source connected to said shield plate for providing a voltage bias thereto to increase the linearity of device operation by providing an effective AC ground.

2. The linear MOSFET device as defined by claim 1 wherein the shield plate is on said major surface and provides lateral shielding between the gate and the drain.

3. The linear MOSFET device as defined by claim 1 wherein said channel is of second conductivity type opposite to said first conductivity type.

4. A linear MOSFET device as defined by claim 1 wherein said voltage source comprises a variable DC voltage source.

5. The linear MOSFET device as defined by claim 4 and further including an AC ground connection to said shield plate.

6. The linear MOSFET device as defined by claim 5 and further including a peak envelope detector coupled to a signal input to said gate and coupled to said shield plate, whereby DC voltage on the shield plate is changed in response to peak input signals.

7. The linear MOSFET device as defined by claim 5 and including at least one additional linear MOSFET device, said devices being connected in parallel for RF power amplification, said voltage source altering DC bias voltage for matching device operation parameters.

8. The linear MOSFET device as defined by claim 5 and further including at least one additional device, said additional device formed in a semiconductor substrate, a plurality of temperature sensor in said substrate, and means coupling said temperature sensors to a voltage source to vary voltage on a shield plate of said additional device to compensate for temperature differences of said devices.

9. The linear MOSFET device as defined by claim 5 wherein said device comprises a lateral MOSFET device.

10. The linear MOSFET device as defined by claim 5 wherein said device comprises a vertical MOSFET device.

11. The linear MOSFET device as defined by claim 1 wherein said device comprises a lateral MOSFET device.

12. The linear MOSFET device as defined by claim 1 wherein said device comprises a vertical MOSFET device.

13. A linear MOSFET device comprising:
    a semiconductor body,
    a source region in said body,
    a drain region in said body and spaced from the source region by a channel,
    a gate positioned over the channel and over a portion of the drain region,
    a shield plate positioned under the gate and over a portion of the drain region to reduce gate-drain capacitance but with no overlap of the channel, and
    a voltage source connected to the shield plate for providing a voltage bias thereto to increase linearity of device operation by providing an effective AC ground.

14. The linear MOSFET device as defined by claim 13 wherein the shield plate is on said major surface and provides lateral shielding between the gate and the drain.

15. The linear MOSFET device as defined by claim 13 wherein the shield plate underlies the gate and is positioned between the gate and drain and provides vertical shielding between the gate and the drain.

16. The linear MOSFET as defined by claim 13 wherein said voltage source comprises a variable DC voltage source.

17. The linear MOSFET device as defined by claim 16 and further including an AC ground connection to said shield plate.

18. The linear MOSFET device as defined by claim 17 and further including a peak envelope detector coupled to a signal input to said gate and coupled to said shield plate, whereby DC voltage on the shield plate is changed in response to peak input signals.

19. The linear MOSFET device as defined by claim 17 and including at least one additional linear MOSFET device, said devices connected in parallel for RF power amplification, said voltage source altering DC bias voltage for matching device operation parameters.

20. The linear MOSFET device as defined by claim 17 and further including at least one additional device, said device formed in a common semiconductor substrate, a plurality temperature sensor in said substrate, and means coupling temperature sensor to a voltage source to vary voltage on a shield plate of said additional device to compensate for temperature differences of said devices.

21. The linear MOSFET device as defined by claim 17 wherein said device comprises a vertical MOSFET device.

22. The linear MOSFET device as defined by claim 17 wherein said device comprises a lateral MOSFET device.

23. The linear MOSFET device as defined by claim 13 wherein said device comprises a vertical MOSFET device.

24. The linear MOSFET device as defined by claim 13 wherein said device comprises a lateral MOSFET device.

25. A linear MOSFET device comprising:
    a semiconductor body having a major surface,
    a source region of first conductivity-type abutting said surface,
    a drain region of said first conductivity-type abutting said surface and spaced from said source region by a channel,
    a gate overlying said channel and part of said drain and insulated therefrom by a dielectric material,
    a shield plate positioned between said gate and said drain and insulated therefrom,
    a voltage source connected to said shield plate for providing a voltage bias thereto, and
    a peak envelope detector coupled to a signal input to said gate and coupled to said shield plate, whereby DC voltage on the shield plate is changed in response to peak input signals.

26. The linear MOSFET device as defined by claim 25 wherein said voltage source comprises a variable DC voltage source.

27. The linear MOSFET device as defined by claim 26 and further including an AC ground connection to said shield plate.

28. The linear MOSFET device as defined by claim 25 wherein the shield plate is on said major surface and provides lateral shielding between the gate and the drain.

29. A linear MOSFET device comprising:
    a semiconductor body having a major surface,
    a source region of first conductivity-type abutting said surface, a drain region of said first conductivity-type abutting said surface and spaced from said source region by a channel, a gate overlying said channel and part of said drain and insulated therefrom by a dielectric material, a shield plate positioned between said gate and said drain and insulated therefrom but with no overlap of the channel, a voltage source connected to said shield plate for providing a voltage bias thereto to increase linearity of device operation by providing an effective AC ground, and at least one additional linear MOSFET device, said device being connected in parallel for RF power amplification, said voltage source altering DC bias voltage for matching device operation parameters.

30. The linear MOSFET device as defined by claim 29 wherein said voltage source comprises a variable DC voltage source.

31. The linear MOSFET device as defined by claim 30 and further including an AC ground connection to said shield plate.

32. The linear MOSFET device as defined by claim 29 wherein the shield plate is on said major surface and provides lateral shielding between the gate and the drain.

33. A linear MOSFET device comprising:
a semiconductor body having a major surface,
a source region of first conductivity-type abutting said surface,
a drain region of said first conductivity-type abutting said surface and spaced from said source region by a channel,
a gate overlying said channel and part of said drain and insulated therefrom by a dielectric material,
a shield plate positioned between said gate and said drain and insulated therefrom,
a voltage source connected to said shield plate for providing a voltage bias thereto, and
at least one additional device, said additional device formed in a semiconductor substrate, at least one temperature sensor in said substrate, and means coupling said temperature sensor to a voltage source to vary voltage on a shield plate of said additional device to compensate for temperature differences of said devices.

34. The linear MOSFET device as defined by claim 33 wherein said voltage source comprises a variable DC voltage source.

35. The linear MOSFET device as defined by claim 34 and further including an AC ground connection to said shield plate.

36. The linear MOSFET device as defined by claim 33 wherein the shield plate is on said major surface and provides lateral shielding between the gate and the drain.

37. A linear MOSFET device comprising:
a semiconductor body,
a source region in said body,
a drain region in said body and spaced from the source region by a channel,
a gate positioned over the channel and over a portion of the drain region,
a shield plate positioned under the gate and over a portion of the drain region to reduce gate-drain capacitance,
a voltage source connected to the shield plate for providing a voltage bias thereto, and
a peak envelope detector coupled to a signal input to said gate and coupled to said shield plate, whereby DC voltage on the shield plate is changed in response to peak input signals.

38. A linear MOSFET device as defined by claim 37 wherein said voltage source comprises a variable DC voltage source.

39. The linear MOSFET device as defined by claim 38 and further including an AC ground connection to said shield plate.

40. The linear MOSFET device as defined by claim 37 wherein the shield plate is on said major surface and provides lateral shielding between the gate and the drain.

41. A linear MOSFET device comprising:
a semiconductor body,
a source region in said body,
a drain region in said body and spaced from the source region by a channel,
a gate positioned over the channel and over a portion of the drain region,
a shield plate positioned under the gate and over a portion of the drain region to reduce gate-drain capacitance but with no overlap of the channel,
a voltage source connected to the shield plate for providing a voltage bias thereto to increase linearity of device operation by providing an effective AC ground, and
at least one additional linear MOSFET device, said devices connected in parallel for RF power amplification, said voltage source altering DC bias voltage for matching device operation parameters.

42. A linear MOSFET device as defined by claim 41 wherein said voltage source comprises a variable DC voltage source.

43. The linear MOSFET device as defined by claim 42 and further including an AC ground connection to said shield plate.

44. The linear MOSFET device as defined by claim 41 wherein the shield plate is on said major surface and provides lateral shielding between the gate and the drain.

45. A linear MOSFET device comprising:
a semiconductor body,
a source region in said body,
a drain region in said body and spaced from the source region by a channel,
a gate positioned over the channel and over a portion of the drain region,
a shield plate positioned under the gate and over a portion of the drain region to reduce gate-drain capacitance,
a voltage source connected to the shield plate for providing a voltage bias thereto, and
at least one additional device, said additional device formed in a semiconductor substrate, at least one temperature sensor in said substrate, and means coupling said temperature sensor to a voltage source to vary voltage on a shield plate of said additional device to compensate for temperature differences of said devices.

46. A linear MOSFET device as defined by claim 45 wherein said voltage source comprises a variable DC voltage source.

47. The linear MOSFET device as defined by claim 46 and further including an AC ground connection to said shield plate.

48. The linear MOSFET device as defined by claim 45 wherein the shield plate is on said major surface and provides lateral shielding between the gate and the drain.

* * * * *